United States Patent
Craig

(10) Patent No.: US 10,772,245 B2
(45) Date of Patent: Sep. 8, 2020

(54) SYSTEMS AND METHODS FOR THERMAL MANAGEMENT FOR HIGH POWER DENSITY EMI SHIELDED ELECTRONIC DEVICES

(71) Applicant: CommScope Technologies LLC, Hickory, NC (US)

(72) Inventor: Kevin Craig, Dudley, MA (US)

(73) Assignee: CommScope Technologies LLC, Hickory, NC (US)

( * ) Notice: Subject to any disclaimer, the term of this patent is extended or adjusted under 35 U.S.C. 154(b) by 79 days.

(21) Appl. No.: 15/472,596

(22) Filed: Mar. 29, 2017

(65) Prior Publication Data
US 2017/0290209 A1   Oct. 5, 2017

Related U.S. Application Data

(60) Provisional application No. 62/317,929, filed on Apr. 4, 2016.

(51) Int. Cl.
*H05K 7/20* (2006.01)
*H05K 9/00* (2006.01)
(Continued)

(52) U.S. Cl.
CPC ....... *H05K 9/0032* (2013.01); *H01L 21/4882* (2013.01); *H01L 21/52* (2013.01);
(Continued)

(58) Field of Classification Search
None
See application file for complete search history.

(56) References Cited

U.S. PATENT DOCUMENTS

| 7,113,406 B1 | 9/2006 | Nguyen et al. |
| 7,355,857 B2 | 4/2008 | Pirillis et al. |

(Continued)

FOREIGN PATENT DOCUMENTS

| CN | 1802747 A | 7/2006 |
| CN | 2901787 | 5/2007 |

(Continued)

OTHER PUBLICATIONS

International Search Authority, "International Search Report and the Written Opinion for PCT/US2017/024682", "Foreign Counterpart to U.S. Appl. No. 15/472,596", dated Jun. 20, 2017, pp. 1-13, Published in: WO.

(Continued)

*Primary Examiner* — Courtney L Smith
(74) *Attorney, Agent, or Firm* — Fogg & Powers LLC

(57) ABSTRACT

Systems and methods for thermal management for high power density EMI shielded electronic devices. In one embodiment, an electronic module comprises: a circuit board; at least one integrated circuit mounted to the circuit board; at least one electro-magnetic interference (EMI) shield fence mounted to the circuit board, wherein the at least one integrated circuit is mounted within a perimeter defined by the EMI shield fence; a heatsink EMI shield lid secured onto the at least one EMI shield fence, wherein the heatsink EMI shield lid seals the at least one integrated circuit within the at least one EMI shield fence; wherein the heatsink EMI shield lid comprises a spring loaded thermal interface in conductive thermal contact with the at least one integrated circuit.

28 Claims, 8 Drawing Sheets

(51) Int. Cl.
| | |
|---|---|
| *H01L 23/367* | (2006.01) |
| *H01L 23/42* | (2006.01) |
| *H01L 23/433* | (2006.01) |
| *H05K 1/02* | (2006.01) |
| *H01L 21/48* | (2006.01) |
| *H01L 21/52* | (2006.01) |
| *H01L 23/40* | (2006.01) |
| *H01L 23/552* | (2006.01) |
| *H01L 23/00* | (2006.01) |
| *H01L 23/053* | (2006.01) |
| *H05K 1/18* | (2006.01) |

(52) U.S. Cl.
CPC ...... *H01L 23/3675* (2013.01); *H01L 23/4006* (2013.01); *H01L 23/42* (2013.01); *H01L 23/433* (2013.01); *H01L 23/552* (2013.01); *H01L 24/32* (2013.01); *H05K 1/021* (2013.01); *H05K 1/0216* (2013.01); *H05K 7/20409* (2013.01); *H05K 7/20445* (2013.01); *H01L 23/053* (2013.01); *H01L 2023/405* (2013.01); *H01L 2023/4031* (2013.01); *H01L 2023/4087* (2013.01); *H01L 2224/32245* (2013.01); *H01L 2924/14* (2013.01); *H01L 2924/1421* (2013.01); *H01L 2924/3025* (2013.01); *H05K 1/0203* (2013.01); *H05K 1/181* (2013.01); *H05K 2201/10098* (2013.01); *H05K 2201/10265* (2013.01); *H05K 2201/10371* (2013.01); *H05K 2201/10409* (2013.01); *H05K 2201/10522* (2013.01); *H05K 2201/10674* (2013.01); *H05K 2201/10734* (2013.01)

(56) References Cited

U.S. PATENT DOCUMENTS

| | | | |
|---|---|---|---|
| 9,320,183 B1* | 4/2016 | Nagar | H05K 9/0007 |
| 2001/0026440 A1 | 10/2001 | Mellberg et al. | |
| 2003/0156400 A1 | 8/2003 | Dibene et al. | |
| 2004/0257786 A1* | 12/2004 | Murasawa | H01L 23/4006 |
| | | | 361/810 |
| 2007/0211436 A1* | 9/2007 | Robinson | H01L 23/552 |
| | | | 361/719 |
| 2011/0176279 A1 | 7/2011 | Zhao et al. | |
| 2012/0063038 A1 | 3/2012 | Yin et al. | |
| 2012/0329523 A1 | 12/2012 | Stewart et al. | |
| 2014/0219255 A1 | 8/2014 | Eyuboglu et al. | |
| 2015/0342085 A1 | 11/2015 | McKervey et al. | |
| 2017/0188448 A1* | 6/2017 | Liang | H05K 1/0203 |

FOREIGN PATENT DOCUMENTS

| | | |
|---|---|---|
| CN | 101351399 A | 1/2009 |
| CN | 101754667 A | 6/2010 |
| CN | 201528503 U | 7/2010 |
| CN | 101978793 A | 2/2011 |
| CN | 201853688 U | 6/2011 |
| CN | 102833992 A | 12/2012 |
| CN | 202979570 U | 6/2013 |
| CN | 203722973 U | 7/2014 |
| CN | 104576566 A | 4/2015 |
| CN | 105280507 A | 1/2016 |
| JP | H02138797 | 5/1990 |
| JP | 07086786 | 3/1995 |
| JP | H09027576 | 1/1997 |
| JP | 2012009471 A | 1/2012 |
| JP | 5236127 B1 | 7/2013 |

OTHER PUBLICATIONS

European Patent Office, "Extended European Search Report from EP Application No. 17779549.9 dated Nov. 12, 2019", From Foreign Counterpart of U.S. Appl. No. 15/472,596, pp. 1-8; Published in EP.

China National Intellectual Property Administration, "First Office Action from CN Application No. 201780029991.8 dated Aug. 14, 2019", from Foreign Counterpart to U.S. Appl. No. 15/472,596, pp. 121, Published: CN.

China National Intellectual Property Administration, "Second Office Action from CN Application No. 201780029991.8", from Foreign Counterpart to U.S. Appl. No. 15/472,596, dated Apr. 3, 2020, pp. 1 through 21, Published: CN.

China National Intellectual Property Administration, "Notification to Grant Patent Right for Invention from CN Application No. 201780029991.8", from Foreign Counterpart to U.S. Appl. No. 15/472,596, dated Jun. 17, 2020, pp. 1-10, Published: CN.

* cited by examiner

SYSTEMS AND METHODS FOR THERMAL MANAGEMENT FOR HIGH POWER DENSITY EMI SHIELDED ELECTRONIC DEVICES

CROSS-REFERENCE TO RELATED APPLICATIONS

This application claims priority to, and the benefit of, U.S. Provisional Patent Application 62/317,929, titled "SYSTEMS AND METHODS FOR THERMAL MANAGEMENT FOR HIGH POWER DENSITY EMI SHIELDED ELECTRONIC DEVICES" filed on Apr. 4, 2016, which is incorporated herein by reference in its entirety.

BACKGROUND

Modern products that send and receive radio frequency (RF) signals often include digital components and one or more integrated antennas. Both the integrated antennas and the digital components are susceptible to picking up noise that can introduce interference into signals processed by the components. The addition of Electro-Magnetic Interference (EMI) shielding around these components is effective in abating such interference. However, especially in high frequency RF communications applications, the digital components are often implemented using integrated system-on-chip (SOC) devices. With ongoing technological progress, these devices are being fabricated with increasingly smaller footprints, resulting in a corresponding increase in power density associated with these devices. The Flip-Chip Ball Grid Array (FC-BGA) is a mounting technology that has become prevalent for high power density SOC devices because the low case resistance avoids generating unnecessary heat within the area enclosed by the EMI shield. Even still, the active area of the FC-BGA SOC device generates a significant amount of heat concentrated in a small area, and that heat typically must be dissipated with the device completely enclosed within EMI shielding for the SOC device to remain operable.

SUMMARY

The embodiments of the present disclosure provide methods and systems for thermal management for high power density EMI shielded electronic devices and will be understood by reading and studying the following specification.

In one embodiment, an electronic module comprises: a circuit board; at least one integrated circuit mounted to the circuit board; at least one electro-magnetic interference (EMI) shield fence mounted to the circuit board, wherein the at least one integrated circuit is mounted within a perimeter defined by the EMI shield fence; a heatsink EMI shield lid secured onto the at least one EMI shield fence, wherein the heatsink EMI shield lid seals the at least one integrated circuit within the at least one EMI shield fence; wherein the heatsink EMI shield lid comprises a spring loaded thermal interface in conductive thermal contact with the at least one integrated circuit.

DRAWINGS

Embodiments of the present disclosure can be more easily understood and further advantages and uses thereof more readily apparent, when considered in view of the description of the preferred embodiments and the following figures in which.

Figure 2:
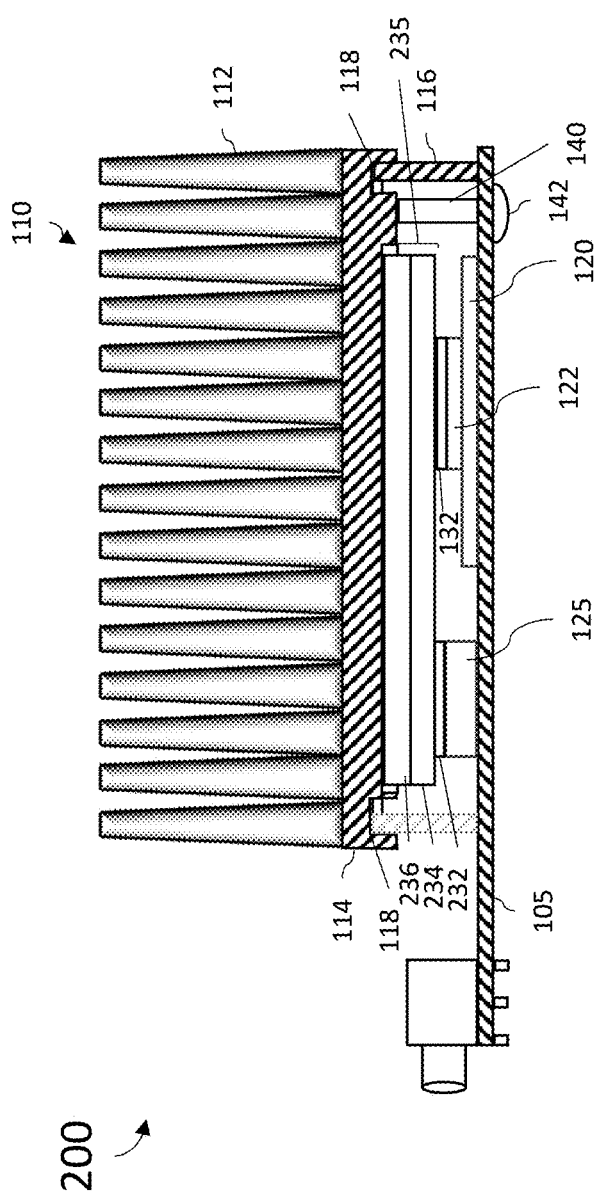
Figure 2A:
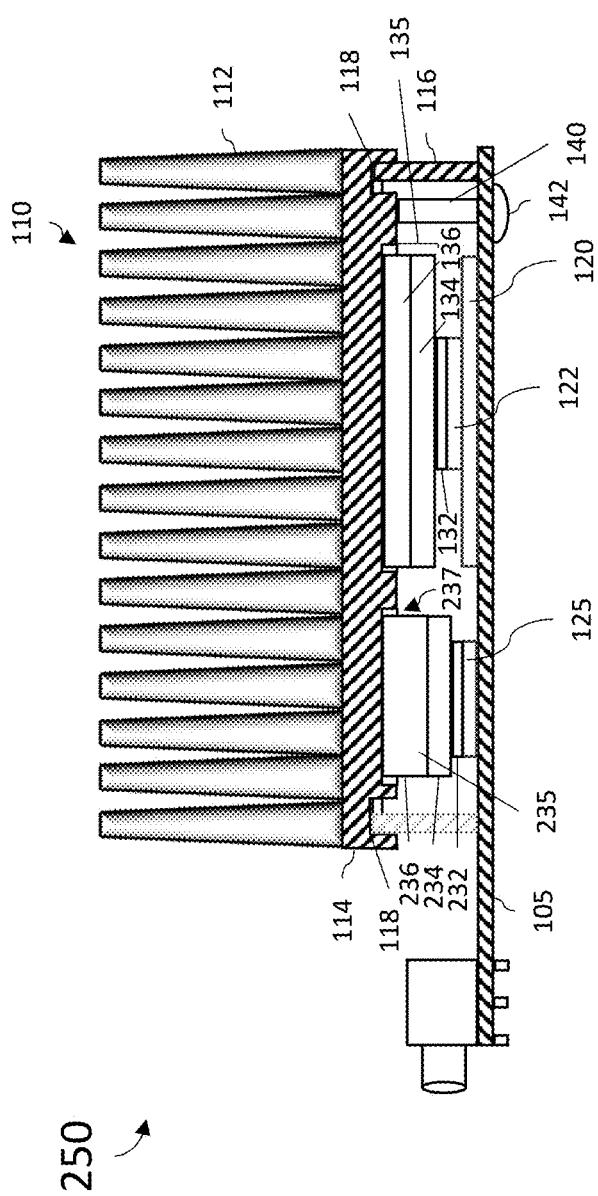
Figure 3:
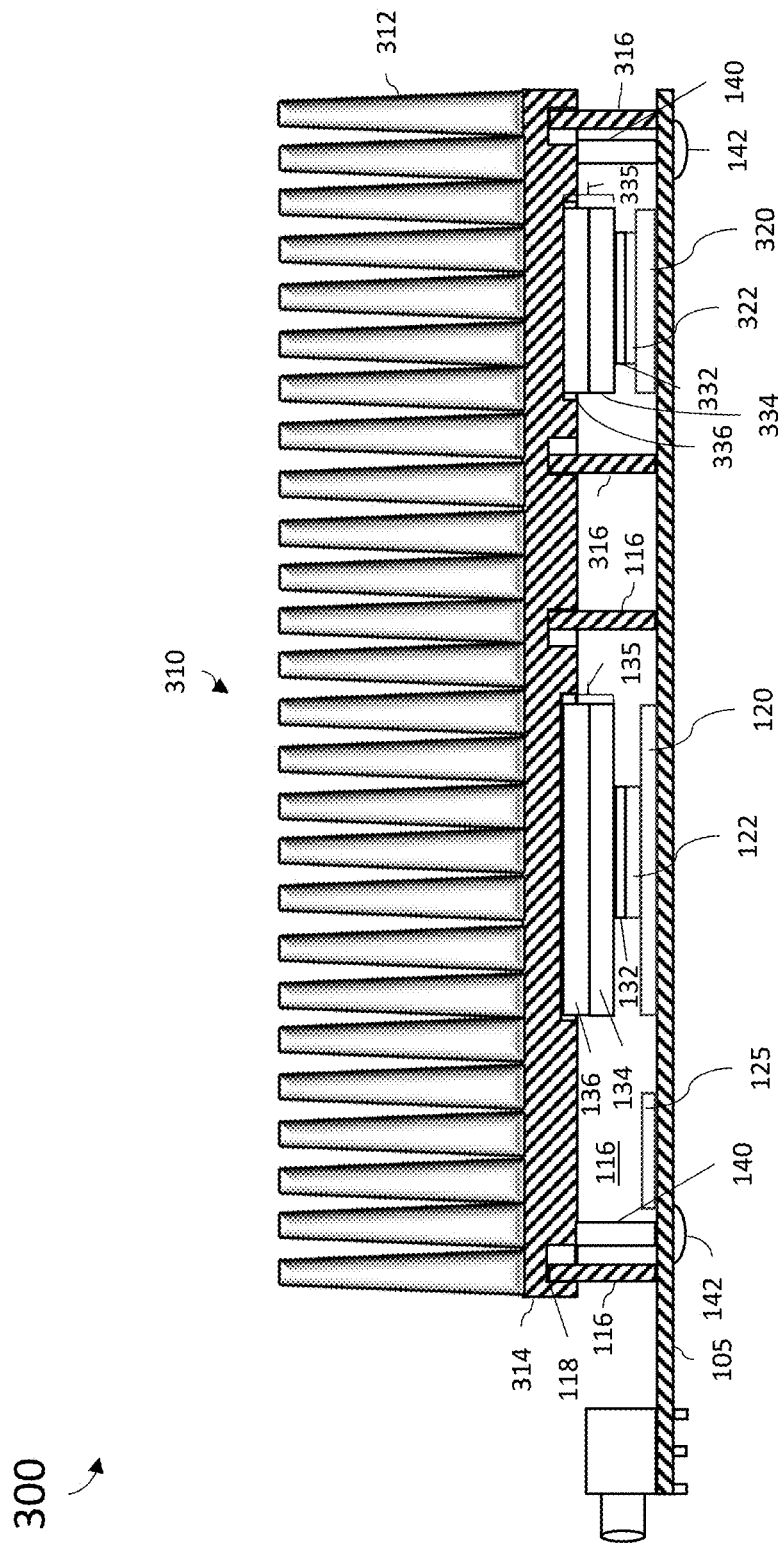

FIGS. 2, and 2A are diagrams illustrating one implementation of radio module 100 with conductive thermal coupling of multiple components within an EMI shield fence to a heat sink EMI shield lid one embodiment of the present disclosure; and FIG. 3 is a diagram illustrating an alternate implementation of radio module 100 coupling multiple components within different EMI shield fences to a common heat sink EMI shield lid of one embodiment of the present disclosure.

In accordance with common practice, the various described features are not drawn to scale but are drawn to emphasize features relevant to the present the embodiments described herein. Reference characters denote like elements throughout figures and text.

DETAILED DESCRIPTION

In the following detailed description, reference is made to the accompanying drawings that form a part hereof, and in which is shown by way of specific illustrative embodiments in which may be practiced. These embodiments are described in sufficient detail to enable those skilled in the art to practice the embodiments, and it is to be understood that other embodiments may be utilized and that logical, mechanical and electrical changes may be made without departing from the scope of the present disclosure. The following detailed description is, therefore, not to be taken in a limiting sense.

Embodiments of the present disclosure provide systems and methods that simultaneously address both thermal management and Electro-Magnetic Interference (EMI) management for high power integrated digital electronics devices. The embodiments disclosed herein may be implemented to manage heat and EMI for small integrated device packages that emit intense heat from a relatively compact area, such as high-frequency RF signal processing device for example. As explained in greater detail below, the embodiments disclosed herein integrate EMI shielding to protect components form digital noise with a cooling mechanism for high power flip-chip BGAs and similar high power density electronic devices. It should be noted, however, that these embodiments may also be employed to manage heat and EMI for larger devices including any integrated circuit that would benefit from both thermal management and Electro-Magnetic Interference (EMI) management.

Figure 1:
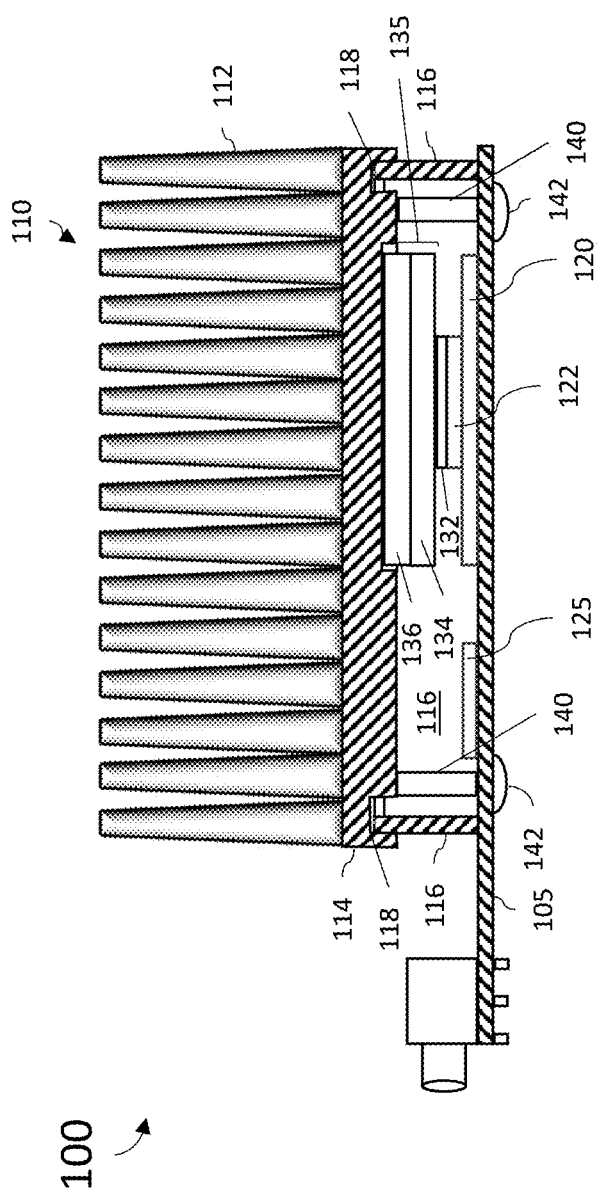
FIGS. 1, 1A and 1B are diagrams illustrating a radio module 100 of one embodiment of the present disclosure.
Figure 1A:
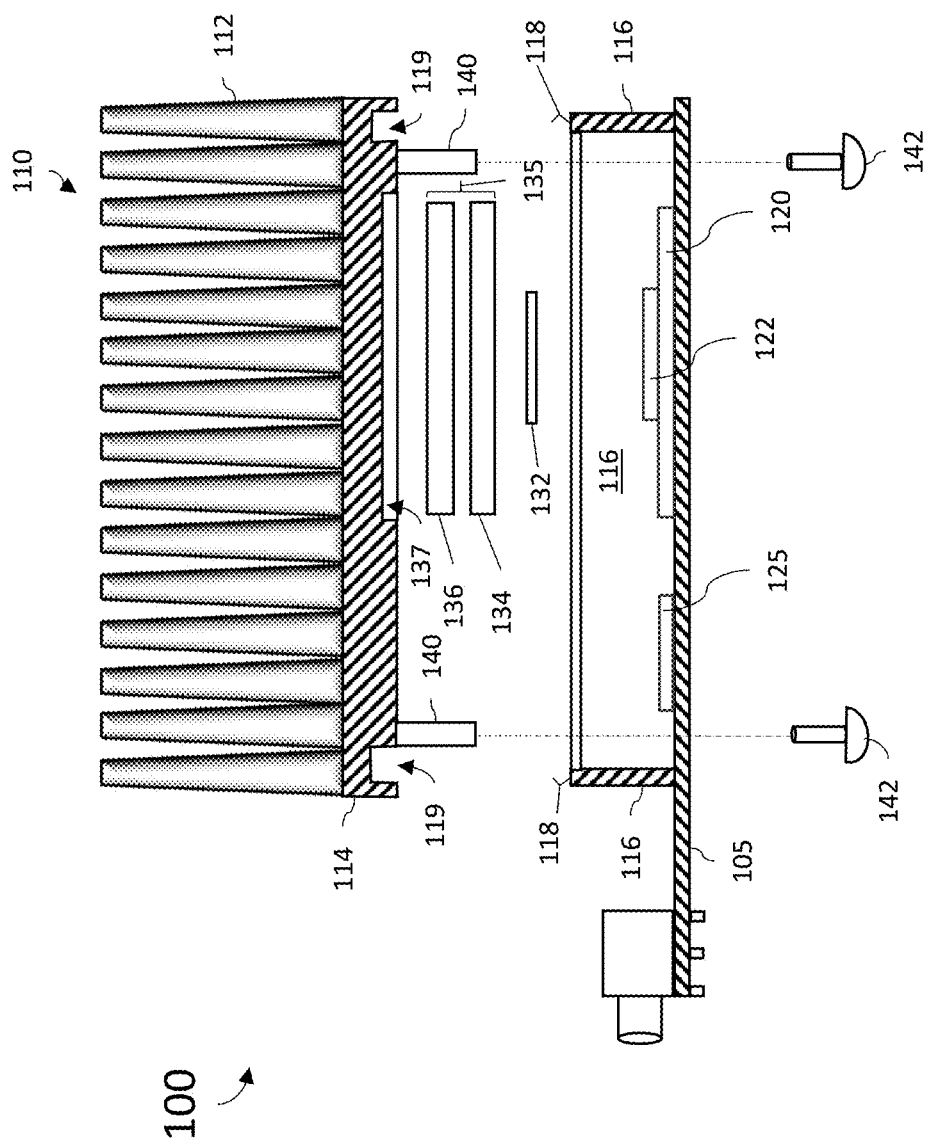
Figure 1B:
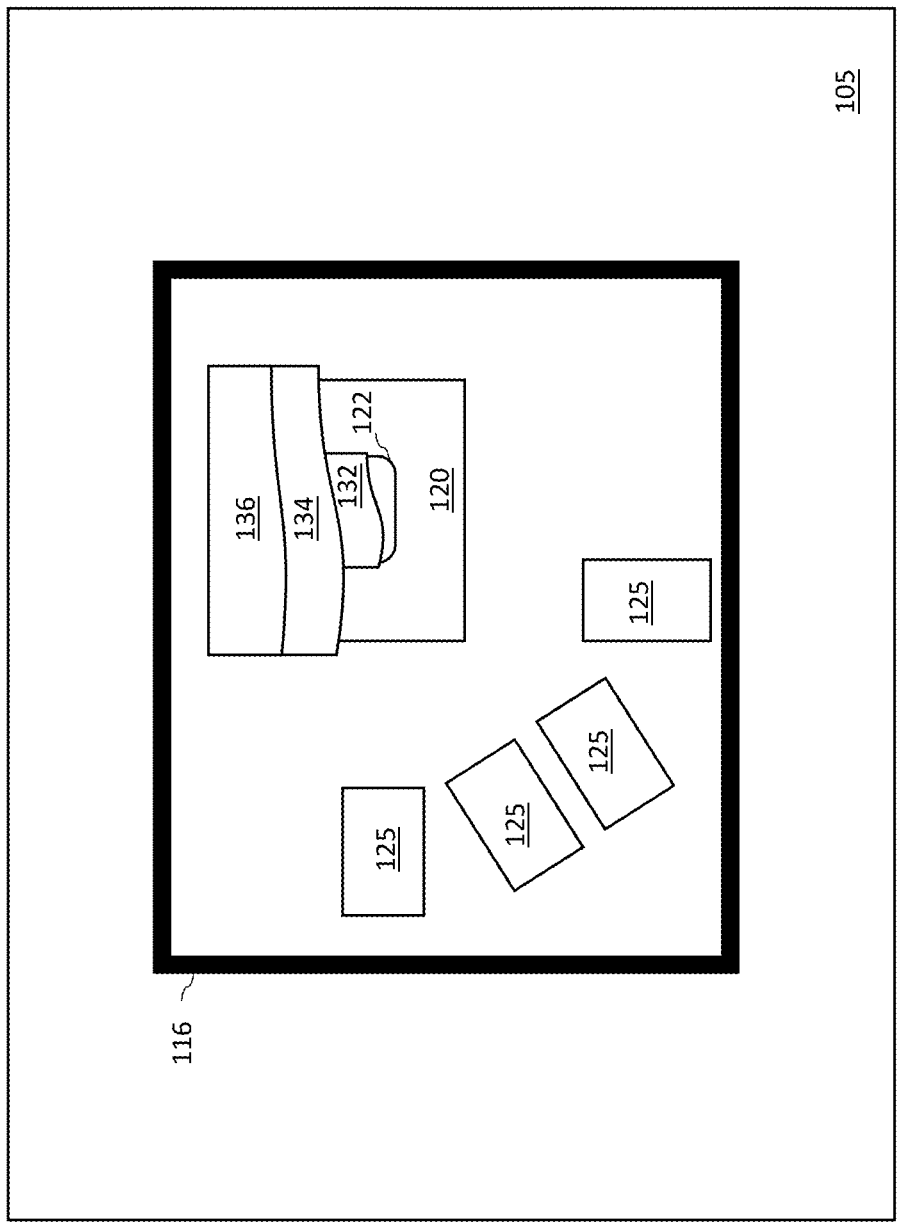

The embodiments described herein present a solution that combines EMI shielding with a heatsink such as illustrated by the example radio module 100 illustrated in FIGS. 1, 1A and 1B. FIG. 1 is an assembled cross-sectional view of radio module 100, FIG. 1A illustrates an exploded view of radio module 100 and FIG. 1B illustrates a top view with the heatsink EMI shield lid 110 removed to reveal components within the EMI shield fence 116.

Although various embodiments refer to a module 100 as a "radio module" utilizing the thermal and EMI management solution described herein, it should be appreciated that the present disclosure is not so limited. That is, electronic devices operating at radio frequencies (RF) are specifically known to be used in conjunction with EMI shielding.

However, other electronic devices that comprise high density heat producing components may also be utilized conjunction with EMI shielding. Accordingly, it is expressly contemplated that the description of any of the embodiments herein with respect thermal and EMI management for radio modules also apply generally to a wider spectrum of electronic modules.

In alternate implementations the module 100 may comprise a component of a wireless network access point (such as a wireless local area network access point), a cellular radio access network (RAN), a distributed antenna system (DAS) remote antenna unit, or a cellular base station or evolved Node B (for example, a radio point for a cloud or centralized RAN (C-RAN) architecture system). In some implementations, radio module 100 may comprise any product with an integrated antenna. In other implementation, the module does not comprise an integrated antenna.

Figure 1C:
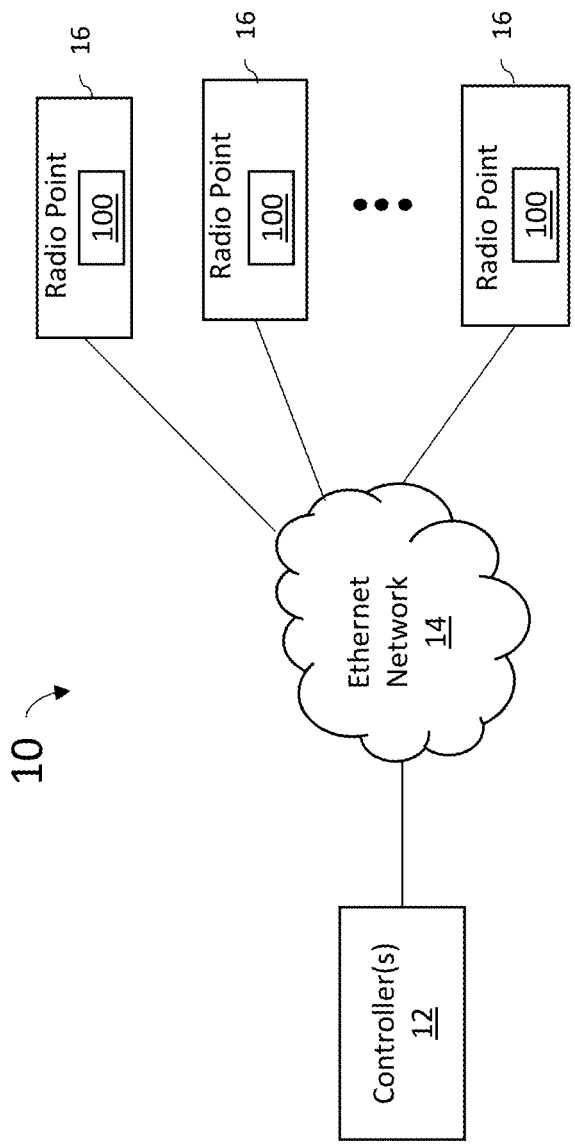
FIG. 1C is a diagram of illustrating an example centralized radio access network (C-RAN) of one embodiment of the present disclosure.

As another example, FIG. 1C is a block diagram that illustrates a C-RAN at 10 of one embodiment of the present disclosure. In this embodiment, one or more controllers 12 are coupled to a plurality of radio points 16 over an Ethernet network 14. In one implementation of C-RAN 10, the Ethernet network 14 is implemented over copper wiring and may further comprise one or more Ethernet switches coupled by the copper wiring. In other implementations, other transport media may be used such as but not limited to fiber optic cables. Alternate example architectures for C-RAN 10 are disclosed by U.S. patent application Ser. No. 13/762,283, filed on Feb. 7, 2013, and titled "RADIO ACCESS NETWORKS" which is incorporated herein by reference in its entirety. With embodiments of the present disclosure, one or more of the radio points 16 may comprise an electronics module 100 such as radio module 100 that includes thermal and EMI management including a heatsink EMI shield lid installed in combination with EMI shield fence as described below. In such embodiments, part of the baseband processing for the air interface is performed in the remote radio points 16 thus reducing the amount of data that is front-hauled between the controller 12 and the radio points 16. The embodiments described herein facilitate shifting of baseband processing to remote radio points 16 by providing thermal and EMI management for high power density components that perform the processing.

Figure 1D:
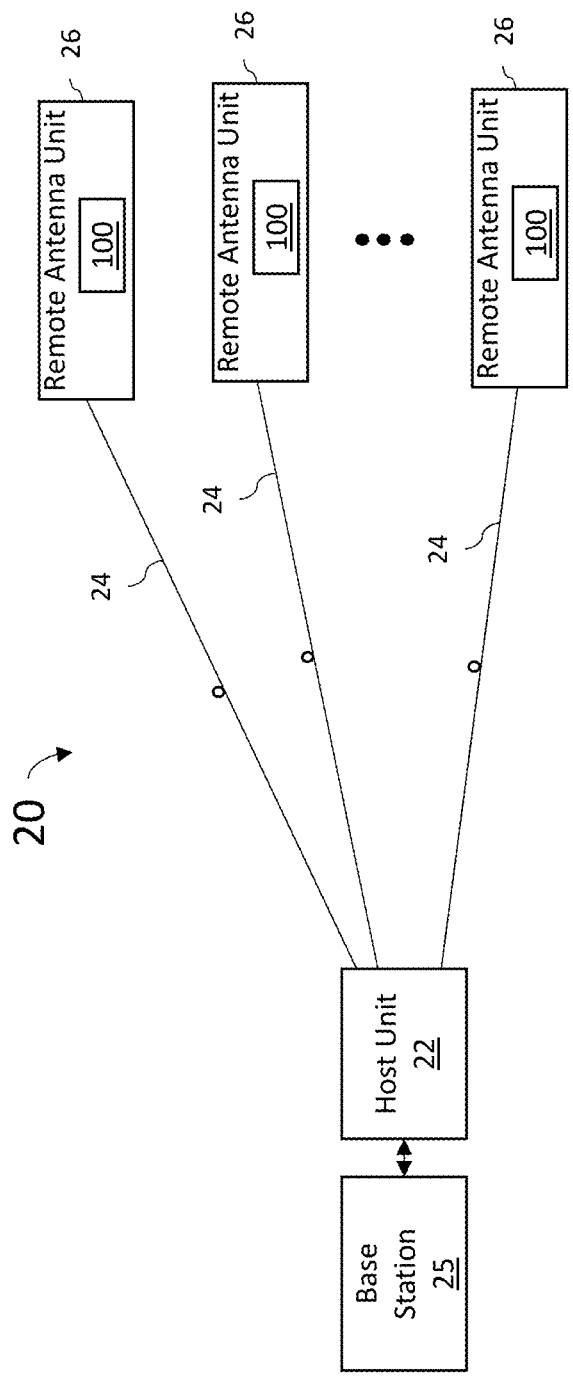
FIG. 1D is a diagram of illustrating an example distributed antenna system (DAS) of one embodiment of the present disclosure.

For example, FIG. 1D is a block diagram that illustrates a distributed antenna system at 20 of one embodiment of the present disclosure. DAS 20 comprises a host unit 22 coupled to a plurality of remote antenna units (shown at 26) by a plurality of digital transport links 24. Remote antenna units 26 may be directly coupled to a host unit 22 or indirectly coupled to host unit 22 via one or more intervening devices. Digital transport links 24 may comprise fiber optic links as shown in FIG. 1D, but in other implementation may comprise other materials such as but not limited to copper wires. In the downlink direction, DAS 20 operates as a point-to-multipoint transport for RF signals. Downlink signals received by DAS 20 at host unit 22 (for example, from a base station (BS) 25) are simultaneously transported to each of the remote antenna units 26. In the uplink direction, RF signals collected at each of the remote antenna units 26 are transported to the host unit 22, where the RF signals are aggregated to provide a unified RF signal to further upstream components. Alternate example architectures for DAS 20 are disclosed by U.S. patent application Ser. No. 13/495,220, filed on Jun. 13, 2013, and titled "Distributed Antenna System Architectures" which is incorporated herein by reference in its entirety. With embodiments of the present disclosure, one or more of the remote antenna units 26 may comprise an electronics module 100 such as radio module 100 that includes thermal and EMI management including a heatsink EMI shield lid installed in combination with EMI shield fence as described below.

Returning to FIGS. 1, 1A and 1B, Radio module 100 comprises an integrated device 120 having an active region 122 mounted onto a circuit board 105. In one embodiment, active region 122 when in operation may periodically or continuously produce and emit heat that may be characterized as having a high power density. In one embodiment, integrated device 120 comprises a system-on-a-chip fabricated using a flip-chip architecture and is electrically coupled to circuit board 105 using ball-grid-array (BGA) mounting technology. Ball-grid-array mounting interfaces are often utilized for devices having a high power density. Flip-chip architectures (also known as controlled collapse chip connection or C4 architectures) are also beneficial for such applications because they avoid the thermal implications and inefficiencies of wire bonding to electrically couple the chip to a circuit board. The use of flip-chip BGA devices is provided as an example and it is expressly noted that in other embodiments, integrated device 120 may comprise other fabrication architectures and/or mounting technologies.

Radio module 100 further comprises an EMI shield fence 116 that is bonded to the circuit board 105 to define a perimeter around device 120, which is illustrated by example in FIG. 1B. EMI shield fence 116 may be constructed from materials known to those in the art of EMI shielding. The EMI shield fence 116 may comprise for example, a folded metal or metal plated material. In some embodiments, one or more electronic chip devices 125 in addition to integrated device 120 may also be mounted to circuit board 105 within the perimeter defined by EMI shield fence 116. The EMI shield fence 116 may be bounded to circuit board 105 during a fabrication process that mounts other electronic device parts onto the circuit board 105.

As shown in FIG. 1, radio module 100 further comprises a heatsink EMI shield lid 110 that includes an EMI shield lid 114 having a plurality of heatsink fins 112. Heatsink fins 112 may comprise an array of pin fins or other heatsink fin configurations. The bottom surface of the heat sink lid 114 includes a groove 119 that corresponds to and aligns with the position of the EMI shield fence 116. That is, when the heatsink EMI shield lid 110 is installed close the EMI shield fence 116, the EMI shield fence 116 is at least partially inserted into the groove 119 so that a portion of the heat sink lid 114 extends over and below the top of the EMI shield fence 116. Insertion of the fence 116 into groove 119 both lengthens and complicates the path that EMI signal leakage must travel to circumvent the EMI shield fence 116. The embodiment shown in FIGS. 1 and 1A also introduces an optional spring feature 118 at the interface between the fence 116 and the EMI shield lid 114 to further inhibit high frequency EMI transmissions. Spring feature 118 is an enhancement to accommodate manufacturing tolerances where small paths at the interface between the EMI shield lid 114 and the EMI shield fence 116 may remain. Spring feature 118 may comprise, for example, a folded metal strip or other material that when compressed between the EMI shield lid 114 and the EMI shield fence 116 fill those EMI signal leakage paths.

The bottom or inside surface of the EMI shield lid 114 is thermally coupled to the active region 122 of integrated device 120 by a spring loaded thermal interface 135 and includes compression stop standoffs 140 to prevent damage to integrated device 120 due to over-compression. The spring loaded thermal interface 135 provides the dual purpose of establishing an interface for a direct low resistance conductive heat path from the active region 122 of integrated device 120 to the heatsink fins 112 while also maintaining a spring loaded force on the active region 122 to ensure that the conductive thermal interface is maintained.

As shown in FIGS. 1 and 1A, in one embodiment, the spring loaded thermal interface 135 comprises a heat spreader 134 that is coupled to a thermal gap pad 136. In one embodiment, the spring loaded thermal interface 135 is attached to the EMI shield lid 114 by the thermal gap pad 136, which resides at least partially recessed into recessed pocket 137 of the EMI shield lid 114. A high-flow thermal interface material (TIM) 132 may be applied to the active region 122 of integrated device 120 to further facilitate conductive heat flow. As the active region 122 heats up during operation of integrated device 120, the high-flow TIM 132 becomes liquefied. Therefore it only needs to be applied where the heat is concentrated, which would correspond to the active heat producing region 122 of the integrated device 120. Accordingly, for implementations where the full surface area of the integrated device 120 comprises an active portion of the chip, then the high-flow TIM 132 may be used to cover the full surface area. When the heatsink EMI shield lid 110 is installed in place over fence 116, the heat spreader 134 become in thermally conductive contact with the active region 122 of integrated device 120 via the high-flow TIM 132. This configuration provides a very low thermal resistance interface between active region 122 and the heatsink EMI shield lid 110. The heatsink EMI shield lid 110 is also functioning as the lid that seals the EMI shield fence 116.

Heat spreader 134 functions to quickly absorb the high density thermal energy from the active region 122 of integrated device 120 and conductively spread that heat into a larger area thus lowering the heat density. In one embodiment, the heat spreader 134 may be implemented using a copper or aluminum metal plate or slug. The heat can then pass through the thermal gap pad 136 to dissipate into the body of the EMI shield lid 114 and then radiate into the surrounding environment through the heatsink fins 112. The thermal gap pad 136 comprises an elastomer material that generates the spring loading force applied by the heat spreader 134 onto the active region 122 of integrated device 120. In one implementation, thermal gap pad 136 may comprise a silicone based rubber. In other implementations, other thermal gap pad materials known to those of skill in the art may be used. Dimensional differences in manufactured parts, even those that conform to specified tolerances, can accumulate in such a way that two otherwise identical circuit board assemblies will have slight dimensional differences with respect to each other. The spring loading of the heat spreader 134 onto the active region 122 of integrated device 120 applied by the elastic properties of thermal gap pad 136 means that when the elements of module 100 are assembled, the spring loaded thermal interface 135 will accommodate those differences and still provide a conductive heat path from the active region 122 of integrated device 120 to the heatsink EMI shield lid 110. Further, in operation, the elastic properties of thermal gap pad 136 ensure a constitute thermal interface between the active region 122 of integrated device 120 and the heatsink EMI shield lid 110 even during thermal transients that may produce thermal expansion or contraction of elements in module 100.

The one or more compression stop standoffs 140 extend from the bottom surface of the EMI shield lid 114 down to the circuit board 105 and are positioned inside the area surrounded by the EMI shield fence 116. The compression stop standoffs 140 accept fastening hardware 142 that penetrates through the circuit board 105 to secure the heatsink EMI shield lid 110 to the EMI shield fence 116. The compression stop standoffs 140 are also sized in length to bottom out (that is, contact with circuit board 105) at a point that provides a desired amount of compression of thermal gap pad 136 and to prevent placing excess pressure onto integrated device 120.

FIG. 1B is a top view illustration of module 100 with heatsink EMI shield lid 110 removed to reveal components within the perimeter defined by EMI shield fence 116. As shown in FIG. 1B, integrated device 120 is mounted to circuit board 105 within the perimeter of EMI shield fence 116. The high-flow TIM 132, heat spreader 134 and thermal gap pad 136 are each illustrated using a peal-away view to show the layering of these elements over the active region 122 of integrated device 120. The high-flow TIM 132 over the active region 122 of integrated device 120. Active region 122 represents the region of integrated device 120 where heat producing circuits are concentrated resulting in a high thermal density in that area. The heat spreader 134 is positioned over the high-flow TIM 132, and spring loaded by the partially compressed elastomeric material of the thermal gap pad 136 to push down upon the active region 122. In some embodiments, the heat spreader 134 is sized to at least overlay, and in some embodiments to extend beyond the area of active region 122.

As illustrated by FIGS. 1, 1A and 1B, in some embodiments, one or more additional electronic devices 125 that may also be present within the perimeter defined by EMI shield fence 116. In some cases, these devices 125 may operate adequately without the need to conductively couple them to the heatsink EMI shield lid 110 to dissipate heat. However, in other embodiments, as shown in FIGS. 2 and 2A, one or more of the additional electronic devices 125 may also be conductively coupled to the heatsink EMI shield lid 110 by a spring loaded thermal interface in a similar manner as described with respect to integrated device 120.

For example, FIG. 2 illustrates at 200 an alternate implementation of radio module 100 where a common spring loaded thermal interface 235 includes a heat spreader 234 and a thermal gap pad 236 that accommodate multiple electronic devices within the EMI shielding fence 116. For example, in this example embodiment, the active region 122 of integrated device 120 is thermally coupled to the spring loaded thermal interface 235 via high-flow TIM 132. The additional electronic device 125 is also thermally coupled to the spring loaded thermal interface 235 via a second high-flow TIM 232. The spring loaded thermal interface 235 functions in the same manner described with respect to the spring loaded thermal interface 135 described above to maintain a consistent contact between the heat spreader 234 and both the electronic device 125 and the active region 122 of integrated device 120 to facilitate heat transfer to the heatsink EMI shield lid 110.

FIG. 2A illustrates another variation at 250 of an alternate implementation of radio module 100 where separate spring loaded thermal interfaces accommodate thermal management for integrated device 120 and at least one additional second electronic device 125. The spring loaded thermal interface 135 conductively couples the active region 122 of integrated device 120 to the heatsink EMI shield lid 110 in the same manner as described above for radio module 100 in FIG. 1. In this embodiment, a second spring loaded thermal interface 235 is included that comprises a second heat spreader 234 and a second thermal gap pad 236 thermally coupled to device 125 via a second high-flow TIM 232. The spring loaded thermal interface 235 also functions in the same manner described with respect to the spring loaded thermal interface 135 above to maintain a consistent contact between the heat spreader 234 and the second electronic device 125 to facilitate heat transfer to the heatsink EMI shield lid 110.

FIG. 3 illustrates at 300 yet another alternate implementation of radio module 100. As shown in FIG. 3, in some embodiments, a single heatsink EMI shield lid may be utilized as the lid for plurality of separate EMI shield fences and provide thermal management to multiple devices positioned within those separate EMI shield fences. For example, in the embodiment of FIG. 3, integrated device 120 is positioned on circuit board 105 within a first area surrounded by EMI shield fence 116 while a second integrated device 320 is positioned on circuit board 105 within a second area surrounded by EMI shield fence 316. The separate EMI shield fences 116 and 316 are both covered by a common heatsink EMI shield lid 310. As with the embodiments above, heatsink EMI shield lid 310 comprises an EMI shield lid 314 having a plurality of heatsink fins 312. Integrated device 120 is conductively thermally coupled to the EMI shield lid 314 by spring loaded thermal interface 135 as described above.

Similarly, the second integrated device 320 is conductively thermally coupled to the EMI shield lid 314 by spring loaded thermal interface 335. More specifically, the second integrated device 320 include an active region 322. Active region 322 when in operation may periodically or continuously produce and emit heat that may be characterized as having a high power density. In one embodiment, integrated device 320 comprises a system-on-a-chip fabricated using a flip-chip architecture and is electrically coupled to circuit board 105 with using ball-grid-array (BGA) mounting technology. The spring loaded thermal interface 335 comprises a heat spreader 334 that is coupled to a thermal gap pad 336. In one embodiment, the spring loaded thermal interface 335 is attached to the EMI shield lid 314 by the thermal gap pad 336, which resides at least partially recessed into a recessed pocket of the EMI shield lid 314. A high-flow thermal interface material (TIM) 332 may be applied to the active region 322 of integrated device 320 to further facilitate conductive heat flow. As the active region 322 heats up during operation of integrated device 320, the high-flow TIM 332 becomes liquefied. The elastic properties of thermal gap pad 336 ensure a constitute thermal interface between the active region 322 of integrated device 320 and the heatsink EMI shield lid 310 even during thermal transients and accommodates manufacturing tolerances as described above. Heat spreader 334 functions to quickly absorb the high density thermal energy from the active region 322 of integrated device 320 and conductively spread that heat into a larger area thus lowering the heat density. In one embodiment, the heat spreader 334 may be implemented using a copper or aluminum metal plate or slug. The heat can then pass through the thermal gap pad 336 to dissipate into the body of the EMI shield lid 314 and then radiate into the surrounding environment through the heatsink fins 312.

Example Embodiments

Example 1 includes an electronic module, the module comprising: a circuit board; at least one integrated circuit mounted to the circuit board; at least one electro-magnetic interference (EMI) shield fence mounted to the circuit board, wherein the at least one integrated circuit is mounted within a perimeter defined by the EMI shield fence; and a heatsink EMI shield lid secured onto the at least one EMI shield fence, wherein the heatsink EMI shield lid seals the at least one integrated circuit within the at least one EMI shield fence; wherein the heatsink EMI shield lid comprises a spring loaded thermal interface in conductive thermal contact with the at least one integrated circuit.

Example 2 include the module of example 1, wherein the heatsink EMI shield lid comprises: an EMI shield lid member having a first surface that interfaces with the at least one EMI shield fence and an opposing second surface comprising a plurality of heatsink fins.

Example 3 include the module of example 2, wherein the EMI shield lid member comprises one or more compression stop standoffs extending from the first surface, wherein the one or more compression stop standoffs have a calibrated length that limits compression of the spring loaded thermal interface.

Example 4 include the module of example 3, wherein the EMI shield lid member is mounted to the circuit board by one or more fasteners that penetrate through the circuit board and into the one or more compression stop standoffs.

Example 5 include the module of any of examples 2-3, wherein the first surface that interfaces with the at least one EMI shield fence comprises at least one groove aligned with the EMI shield fence, wherein the at least one EMI shield is at least partially inserted into the at least one groove.

Example 6 include the module of example 5, further comprising a spring feature positioned at an interface between the at least one EMI shield fence and the EMI shield lid member.

Example 7 include the module of any of examples 2-6, wherein the spring loaded thermal interface comprises a heat spreader coupled to a thermal gap pad, wherein the a thermal gap pad is coupled to the first surface of the EMI shield lid and the heat spreader is conductively thermally coupled to an active region of the at least one integrated circuit.

Example 8 include the module of example 7, wherein the heat spreader comprises a copper slug.

Example 9 include the module of any of examples 7-8, wherein the heat spreader has a surface area greater than a surface area of the active region of the at least one integrated circuit.

Example 10 include the module of any of examples 7-9, wherein the heat spreader is conductively thermally coupled to the active region of the at least one integrated circuit through a high-flow thermal interface material.

Example 11 include the module of any of examples 1-10, wherein the at least one integrated circuit comprises a flip-chip architecture and is coupled to the circuit board by a ball-grid-array (BGA) mounting technology.

Example 12 include the module of any of examples 1-11, wherein the at least one integrated circuit comprises a system-on-chip device.

Example 13 include the module of any of examples 1-12, wherein the at least one integrated circuit comprises a radio frequency signal processing device and the electronic module is a radio module.

Example 14 include the module of any of examples 1-13, wherein two or more electronic devices are thermally coupled to the heatsink EMI shield lid by a common spring loaded thermal interface.

Example 15 include the module of any of examples 1-14, wherein a first electronic devices is thermally coupled to the heatsink EMI shield lid by a first spring loaded thermal interface, and a second electronic devices is thermally coupled to the heatsink EMI shield lid by a second spring loaded thermal interface.

Example 16 include the module of any of examples 1-15, wherein the module is a component of one of: a wireless network access point; a cellular base station; and a distributed antenna system.

Example 17 includes a thermal and electro-magnetic interference (EMI) management system for an integrated circuit device, the system comprising: at least one electro-magnetic interference (EMI) shield fence, wherein the integrated circuit device is mounted to a substrate within a perimeter defined by the EMI shield fence; an heatsink EMI shield lid that secures onto the at least one EMI shield fence, wherein the heatsink EMI shield lid seals the at least one integrated circuit within the at least one EMI shield fence; wherein the heatsink EMI shield lid comprises a spring loaded thermal interface configured to compress against the at least one integrated circuit.

Example 18 include the system of example 17, wherein the substrate comprises a circuit board.

Example 19 include the system of any of examples 17-18, wherein the heatsink EMI shield lid comprises: an EMI shield lid member having a first surface that interfaces with the at least one EMI shield fence and an opposing second surface comprising a plurality of heatsink fins.

Example 20 include the system of example 19, wherein the EMI shield lid member comprises one or more compression stop standoffs extending from the first surface, wherein the one or more compression stop standoffs have a calibrated length that limits compression of the spring loaded thermal interface.

Example 21 include the system of any of examples 19-20, wherein the EMI shield lid member is mounted to the substrate by one or more fasteners that penetrate through the substrate and into the one or more compression stop standoffs.

Example 22 include the system of any of examples 19-21, wherein the first surface that interfaces with the at least one EMI shield fence comprises at least one groove aligned with the at least one EMI shield fence, wherein the at least one EMI shield is at least partially inserted into the at least one groove.

Example 23 include the system of any of examples 17-22, wherein the spring loaded thermal interface comprises a heat spreader coupled to a thermal gap pad, wherein the a thermal gap pad is coupled to the first surface of the EMI shield lid; and wherein the heat spreader is configured to conductively thermally coupled to an active region of the integrated circuit.

Example 24 include the system of example 23, wherein the heat spreader comprises a copper slug.

Example 25 include the system of any of examples 23-24, wherein the heat spreader has a surface area greater than a surface area of the active region of the at least one integrated circuit.

Example 26 include the system of any of examples 23-25, further comprising a high-flow thermal interface material positioned between the heat spreader and the active region of the integrated circuit.

Example 27 includes a wireless network access point comprising an electronics module as described in any of claims 1-26.

Example 28 includes a radio point for a cloud RAN architecture system comprising an electronics module as described in any of claims 1-26.

Example 29 includes a cellular radio access network (RAN) system comprising an electronics module as described in any of claims 1-26.

Example 30 includes a distributed antenna system, the system comprising: a plurality of remote antenna units coupled to a host unit, wherein one or more of the remote antenna units comprise an electronics module as described in any of claims 1-26.

Example 31 includes a method for thermal and electro-magnetic interference (EMI) management for an integrated circuit device, the method comprising: surrounding one or more integrated circuit devices within a perimeter defined by at least one electro-magnetic interference (EMI) shield fence; securing a heatsink EMI shield lid onto the at least one EMI shield fence, wherein the heatsink EMI shield lid seals the at least one integrated circuit within the at least one EMI shield fence, wherein the heatsink EMI shield lid comprise a spring loaded thermal interface; and applying the spring loaded thermal interface against the one or more integrated circuit devices.

Example 32 include the method of example 31, wherein the heatsink EMI shield lid comprises: an EMI shield lid member having a first surface that interfaces with the at least one EMI shield fence and an opposing second surface comprising a plurality of heatsink fins.

Example 33 include the method of any of examples 31-32, wherein the spring loaded thermal interface comprises a heat spreader coupled to a thermal gap pad, the method further comprising: conductively thermal coupling the thermal gap pad to the first surface of the EMI shield lid; and conductively thermal coupling the heat spreader to an active region of the at least one integrated circuit.

Example 34 include the method of example 33, wherein the heat spreader comprises a copper slug.

Example 35 include the method of any of examples 33-34, wherein the heat spreader has a surface area greater than a surface area of the active region of the at least one integrated circuit.

Example 36 include the method of any of examples 33-35, wherein the heat spreader is conductively thermally coupled to the active region of the at least one integrated circuit through a high-flow thermal interface material.

Example 37 include the method of any of examples 32-36, wherein the EMI shield lid member comprises one or more compression stop standoffs extending from the first surface, wherein the one or more compression stop standoffs have a calibrated length that limits compression of the spring loaded thermal interface.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the presented embodiments. Therefore, it is manifestly intended that the embodiments of the present disclosure be limited only by the claims and the equivalents thereof.

What is claimed is:

1. An electronic module, the module comprising:
   a circuit board;
   at least one integrated circuit mounted to the circuit board;
   at least one electro-magnetic interference (EMI) shield fence mounted to the circuit board, wherein the at least one integrated circuit is mounted within a perimeter defined by the EMI shield fence; and
   a heatsink EMI shield lid secured onto the at least one EMI shield fence, wherein the heatsink EMI shield lid seals the at least one integrated circuit within the at least one EMI shield fence in order to inhibit EMI transmissions; and wherein the heatsink EMI shield lid comprises a spring loaded thermal interface configured to maintain a spring loaded force on, and in conductive thermal contact with, the at least one integrated circuit;

wherein the heatsink EMI shield lid comprises:

an EMI shield lid member having a first surface that interfaces with the at least one EMI shield fence and an opposing second surface comprising a plurality of heatsink fins;

wherein the first surface that interfaces with the at least one EMI shield fence comprises at least one groove aligned with the EMI shield fence, wherein the at least one EMI shield fence is at least partially inserted into the at least one groove.

2. The module of claim 1, wherein the EMI shield lid member comprises one or more compression stop standoffs extending from the first surface, wherein the one or more compression stop standoffs have a calibrated length that limits compression of the spring loaded thermal interface.

3. The module of claim 2, wherein the EMI shield lid member is mounted to the circuit board by one or more fasteners that penetrate through the circuit board and into the one or more compression stop standoffs.

4. The module of claim 1, further comprising a spring feature positioned at an interface between the at least one EMI shield fence and the EMI shield lid member.

5. The module of claim 1, wherein the spring loaded thermal interface comprises a heat spreader coupled to a thermal gap pad, wherein the thermal gap pad is coupled to the first surface of the EMI shield lid and the heat spreader is conductively thermally coupled to an active region of the at least one integrated circuit.

6. The module of claim 5, wherein the heat spreader comprises a copper slug.

7. The module of claim 5, wherein the heat spreader has a surface area greater than a surface area of the active region of the at least one integrated circuit.

8. The module of claim 5, wherein the heat spreader is conductively thermally coupled to the active region of the at least one integrated circuit through a thermal interface material.

9. The module of claim 1, wherein the at least one integrated circuit comprises a flip-chip architecture and is coupled to the circuit board by a ball-grid-array (BGA) mounting technology.

10. The module of claim 1, wherein the at least one integrated circuit comprises a system-on-chip device.

11. An electronic module, the module comprising:
a circuit board;
at least one integrated circuit mounted to the circuit board;
at least one electro-magnetic interference (EMI) shield fence mounted to the circuit board, wherein the at least one integrated circuit is mounted within a perimeter defined by the EMI shield fence; and
a heatsink EMI shield lid secured onto the at least one EMI shield fence, wherein the heatsink EMI shield lid seals the at least one integrated circuit within the at least one EMI shield fence in order to inhibit EMI transmissions; and
wherein the heatsink EMI shield lid comprises a spring loaded thermal interface configured to maintain a spring loaded force on, and in conductive thermal contact with, the at least one integrated circuit;

wherein the at least one integrated circuit comprises a radio frequency signal processing device and the electronic module is a radio module.

12. The module of claim 1, wherein two or more electronic devices are both thermally coupled to the heatsink EMI shield lid by the spring loaded thermal interface.

13. The module of claim 1, wherein a first electronic device is thermally coupled to the heatsink EMI shield lid by a first spring loaded thermal interface, and a second electronic devices is thermally coupled to the heatsink EMI shield lid by a second spring loaded thermal interface.

14. An electronic module, the module comprising:
a circuit board;
at least one integrated circuit mounted to the circuit board;
at least one electro-magnetic interference (EMI) shield fence mounted to the circuit board, wherein the at least one integrated circuit is mounted within a perimeter defined by the EMI shield fence; and
a heatsink EMI shield lid secured onto the at least one EMI shield fence, wherein the heatsink EMI shield lid seals the at least one integrated circuit within the at least one EMI shield fence in order to inhibit EMI transmissions; and
wherein the heatsink EMI shield lid comprises a spring loaded thermal interface configured to maintain a spring loaded force on, and in conductive thermal contact with, the at least one integrated circuit;
wherein the module is a component of one of:
a wireless network access point;
a cellular base station; and
a distributed antenna system.

15. A thermal and electro-magnetic interference (EMI) management system for an integrated circuit device, the system comprising:
at least one electro-magnetic interference (EMI) shield fence, wherein the integrated circuit device is mounted to a substrate within a perimeter defined by the EMI shield fence; and
an heatsink EMI shield lid that secures onto the at least one EMI shield fence, wherein the heatsink EMI shield lid seals the at least one integrated circuit within the at least one EMI shield fence in order to inhibit EMI transmissions;
wherein the heatsink EMI shield lid comprises a spring loaded thermal interface configured to maintain a spring loaded force on, and in conductive thermal contact with, the at least one integrated circuit;
wherein the heatsink EMI shield lid comprises:
an EMI shield lid member having a first surface that interfaces with the at least one EMI shield fence and an opposing second surface comprising a plurality of heatsink fins;
wherein the EMI shield lid member is mounted to the substrate by one or more fasteners that penetrate through the substrate and into the one or more compression stop standoffs.

16. The system of claim 15, wherein the substrate comprises a circuit board.

17. The system of claim 15, wherein the EMI shield lid member comprises one or more compression stop standoffs extending from the first surface, wherein the one or more compression stop standoffs have a calibrated length that limits compression of the spring loaded thermal interface.

18. A thermal and electro-magnetic interference (EMI) management system for an integrated circuit device, the system comprising:

at least one electro-magnetic interference (EMI) shield fence, wherein the integrated circuit device is mounted to a substrate within a perimeter defined by the EMI shield fence; and an heatsink EMI shield lid that secures onto the at least one EMI shield fence, wherein the heatsink EMI shield lid seals the at least one integrated circuit within the at least one EMI shield fence in order to inhibit EMI transmissions;

wherein the heatsink EMI shield lid comprises a spring loaded thermal interface configured to maintain a spring loaded force on, and in conductive thermal contact with, the at least one integrated circuit;

wherein the heatsink EMI shield lid comprises:

an EMI shield lid member having a first surface that interfaces with the at least one EMI shield fence and an opposing second surface comprising a plurality of heatsink fins;

wherein the first surface that interfaces with the at least one EMI shield fence comprises at least one groove aligned with the at least one EMI shield fence, wherein the at least one EMI shield fence is at least partially inserted into the at least one groove.

19. The system of claim 15, wherein the spring loaded thermal interface comprises a heat spreader coupled to a thermal gap pad, wherein the thermal gap pad is coupled to the first surface of the EMI shield lid; and wherein the heat spreader is configured to conductively thermally coupled to an active region of the integrated circuit.

20. The system of claim 19, wherein the heat spreader comprises a copper slug.

21. The system of claim 19, wherein the heat spreader has a surface area greater than a surface area of the active region of the at least one integrated circuit.

22. The system of claim 19, further comprising a thermal interface material positioned between the heat spreader and the active region of the integrated circuit.

23. A method for thermal and electro-magnetic interference (EMI) management for an integrated circuit device, the method comprising:

surrounding one or more integrated circuit devices within a perimeter defined by at least one electro-magnetic interference (EMI) shield fence;

securing a heatsink EMI shield lid onto the at least one EMI shield fence, wherein the heatsink EMI shield lid seals the at least one integrated circuit within the at least one EMI shield fence in order to inhibit EMI transmissions, wherein the heatsink EMI shield lid comprise a spring loaded thermal interface; and applying the spring loaded thermal interface against the one or more integrated circuit devices, wherein the spring loaded thermal interface is in conductive thermal contact with the one or more integrated circuit devices, and configured to maintain the spring loaded force on the one or more integrated circuit devices wherein the heatsink EMI shield lid comprises:

an EMI shield lid member having a first surface that interfaces with the at least one EMI shield fence and an opposing second surface comprising a plurality of heatsink fins;

wherein the first surface that interfaces with the at least one EMI shield fence comprises at least one groove aligned with the EMI shield fence, wherein the at least one EMI shield fence is at least partially inserted into the at least one groove.

24. The method of claim 23, wherein the EMI shield lid member comprises one or more compression stop standoffs extending from the first surface, wherein the one or more compression stop standoffs have a calibrated length that limits compression of the spring loaded thermal interface.

25. The method of claim 23, wherein the spring loaded thermal interface comprises a heat spreader coupled to a thermal gap pad, the method further comprising:

conductively thermal coupling the thermal gap pad to the first surface of the EMI shield lid; and conductively thermal coupling the heat spreader to an active region of the at least one integrated circuit.

26. The method of claim 25, wherein the heat spreader comprises a copper slug. Reconsideration and withdrawal of these rejections are respectfully requested.

27. The method of claim 25, wherein the heat spreader has a surface area greater than a surface area of the active region of the at least one integrated circuit.

28. The method of claim 25, wherein the heat spreader is conductively thermally coupled to the active region of the at least one integrated circuit through a thermal interface material.

* * * * *